(12) United States Patent
Hashimoto

(10) Patent No.: US 7,075,184 B2
(45) Date of Patent: Jul. 11, 2006

(54) SEMICONDUCTOR DEVICE AND MANUFACTURING METHOD, CIRCUIT BOARD AND ELECTRONIC DEVICE THEREOF

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 27 days.

(21) Appl. No.: 10/763,205

(22) Filed: Jan. 26, 2004

(65) Prior Publication Data

US 2004/0212100 A1    Oct. 28, 2004

(30) Foreign Application Priority Data

Feb. 7, 2003    (JP) ............... 2003-030950

(51) Int. Cl.
  *H01L 23/48*    (2006.01)
  *H01L 23/52*    (2006.01)
  *H01L 29/40*    (2006.01)
  *H01L 21/44*    (2006.01)

(52) U.S. Cl. .............. 257/773; 257/737; 257/738; 257/778; 257/786; 257/780; 438/108; 438/611; 438/613; 438/614

(58) Field of Classification Search ........ 257/701, 257/702, 690, 737, 750, 738, 780, 787, 773, 257/786, 778; 438/106, 618, 614, 612, 613, 438/108, 611
See application file for complete search history.

(56) References Cited

U.S. PATENT DOCUMENTS

| 6,501,169 | B1 | 12/2002 | Aoki et al. ............ 257/700 |
| 6,784,557 | B1* | 8/2004 | Nakamura et al. ....... 257/784 |
| 6,835,595 | B1* | 12/2004 | Suzuki et al. ........... 438/107 |
| 2001/0000116 | A1* | 4/2001 | Shimizu et al. ......... 257/786 |

FOREIGN PATENT DOCUMENTS

| JP | 2000-58695 | 2/2000 |
| JP | 2001-156206 | 8/2001 |

* cited by examiner

*Primary Examiner*—Nitin Parekh
(74) *Attorney, Agent, or Firm*—Oliff & Berridge, PLC

(57) ABSTRACT

The invention enhances the reliability of a semiconductor device. A semiconductor device includes: a semiconductor substrate that includes an active element region, an integrated circuit having an active element in the active element region, and an electrode electrically connected to the integrated circuit; a resin layer that is formed on the surface of the semiconductor substrate where the electrode is also formed, so as to avoid the electrode; a wiring layer that extends from the electrode and across the top of the resin layer, and includes a plurality of electrically connecting portions; and an external terminal that is provided on the electrically connecting portions. The plurality of electrically connecting portions includes a first electrically connecting portion and a second electrically connecting portion. The surface area of the first electrically connecting portion is larger than the surface area of the second electrically connecting portion.

14 Claims, 4 Drawing Sheets

SEMICONDUCTOR DEVICE AND MANUFACTURING METHOD, CIRCUIT BOARD AND ELECTRONIC DEVICE THEREOF

BACKGROUND OF THE INVENTION

1. Field of Invention

The present invention relates to a semiconductor device, a manufacturing method thereof, and a circuit board and an electronic device including the semiconductor device.

2. Description of Related Art

The related art includes wafer-level CSPs (chip size packages), where a packege is manufactured on the wafer level, as packages for semiconductor devices. A semiconductor device manufactured using this method has the same external dimensions as the semiconductor chip and demands greater reliability than other related art semiconductor devices.

SUMMARY OF THE INVENTION

The present invention increases the reliability of semiconductor devices.

A semiconductor device according to the present invention includes: a semiconductor substrate that includes an active element region, an integrated circuit having an active element in the active element region, and an electrode electrically connected to the integrated circuit; a resin layer that is formed on the surface of the semiconductor substrate where the electrode is also formed, so as to avoid the electrode; a wiring layer that extends from the electrode and across the top of the resin layer, and includes a plurality of electrically connecting portions; and an external terminal that is provided on the electrically connecting portions. The plurality of electrically connecting portions includes a first electrically connecting portion and a second electrically connecting portion. The surface area of the first electrically connecting portion is larger than the surface area of the second electrically connecting portion. The present invention has an enhanced light-blocking effect, since the first electrically connecting portion, which is larger in surface area than the second electrically connecting portion, reduces or prevents external light from penetrating the semiconductor substrate. The first electrical connecting portion also provides a shield effect, by blocking electromagnetic waves. The present invention thereby reduces or eliminates semiconductor device malfunctions and enhances semiconductor device reliability.

In this semiconductor device, the second electrically connecting portion may be formed on the top surface of the resin layer. Hence, the resin layer absorbs the stress applied to the second electrically connecting portion.

In this semiconductor device, the resin layer overlaps the active element region of the semiconductor substrate; and the first electrically connecting portion is formed on the area of the resin layer that overlaps the active element region. The present invention thereby further enhances the light-blocking effect and shield effect. Moreover, since the first electrically connecting portion is formed on the resin layer, the resin layer absorbs the stress applied to the first electrically connecting portion.

In this semiconductor device, the first electrically connecting portion may be formed so that it covers nearly the entire top surface of the resin layer.

In this semiconductor device, the first electrically connecting portion may be formed so as to further cover a side surface of the resin layer.

In this semiconductor device, the first electrically connecting portion may be formed so as to extend to the region of the semiconductor substrate beyond the resin layer.

In this semiconductor device, the first electrically connecting portion may supply a ground potential or a power-source potential. The present invention thereby lowers the impedance of the wiring layer and lessens the effects of noise, for example.

In this semiconductor device, the first electrically connecting portion is formed in a shape and/or a size that provides predetermined electrical characteristics.

This semiconductor device may also include an insulating layer formed so as to cover the wiring layer while avoiding the external terminal.

In this semiconductor device, the semiconductor substrate may be a semiconductor chip or a semiconductor wafer.

A semiconductor device according to the present invention includes: a semiconductor substrate that includes an active element region, an integrated circuit having an active element in the active element region, and an electrode electrically connected to the integrated circuit; a resin layer that is formed on the surface of the semiconductor substrate where the electrode is also formed, so as to avoid the electrode; a wiring layer that extends from the electrode and across the top of the resin layer, and includes a plurality of electrically connecting portions; and an external terminal that is provided on the electrically connecting portions. The wiring layer includes a first electrically connecting portion and a second electrically connecting portion; and the first electrically connecting portion covers the entire surface of the resin layer except for the area occupied by the wiring layer including the second electrically connecting portion and the area surrounding the wiring layer including the second electrically connecting portion. The present invention has an enhanced light-blocking effect, since the first electrically connecting portion covers the entire surface of the resin layer and reduces or prevents external light from penetrating the semiconductor substrate. The first electrical connecting portion also provides a shield effect, by blocking electromagnetic waves. The present invention thereby reduces or eliminates semiconductor device malfunctions and enhances semiconductor device reliability.

The aforementioned semiconductor device is mounted to a circuit board according to the present invention.

An electronic device according to the present invention includes the aforementioned semiconductor device.

A method of manufacturing a semiconductor device according to the present invention includes: (a) forming a resin layer on a surface of a semiconductor substrate, the semiconductor substrate including an active element region, an integrated circuit having an active element in the active element region, and an electrode electrically connected to the integrated circuit, and the resin layer being formed so as to avoid the electrode; (b) extending a wiring layer from the electrode across the top of the resin layer, making the wiring layer include a plurality of electrically connecting portions; and (c) providing an external terminal on the electrically connecting portions. The plurality of electrically connecting portions in step (b) being formed so that a surface area of a first electrically connecting portion is larger than a surface area of a second electrically connecting portion. According to the present invention, the surface area of the first electrically connecting portion is larger than the surface area of the second electrically connecting portion. The present invention has an enhanced light-blocking effect, since the first electrically connecting portion, which is larger in surface area than the second electrically connecting portion, reduces or prevents external light from penetrating the semiconductor substrate. The first electrical connecting portion also provides a shield effect, by blocking electromagnetic waves. The present invention thereby reduces or eliminates semiconductor device malfunctions and enhances semiconductor device reliability.

DETAILED DESCRIPTION OF PREFERRED EMBODIMENTS

Exemplary embodiments of the present invention are described below with reference to the figures.

Figure 1:
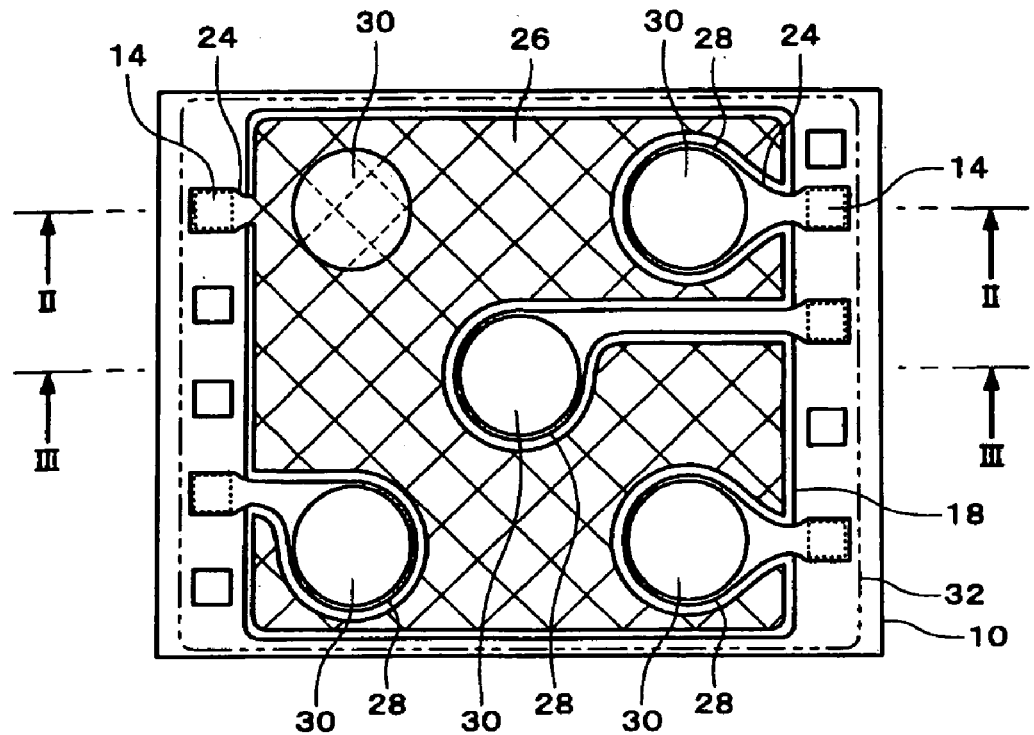
FIG. 1 is a plan view of a semiconductor device according to an exemplary embodiment of the present invention.
Figure 2:
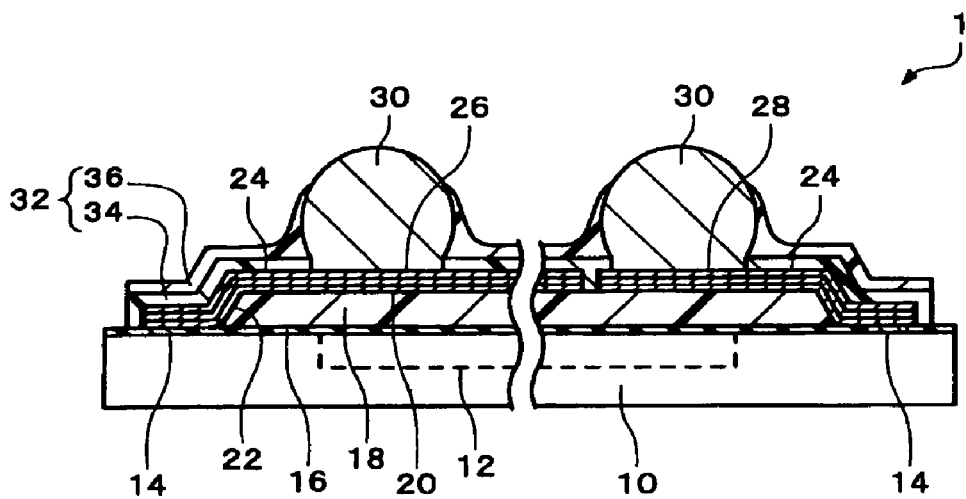
FIG. 2 is a sectional view of the semiconductor device according to an exemplary embodiment of the present invention.
Figure 3:
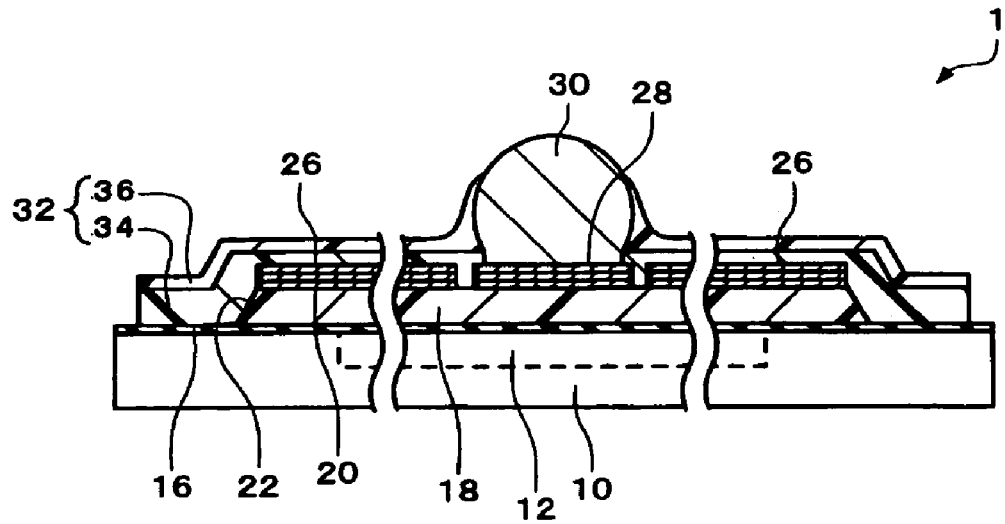
FIG. 3 is a partial plan view of the semiconductor device according to an exemplary embodiment of the present invention.
Figure 4:
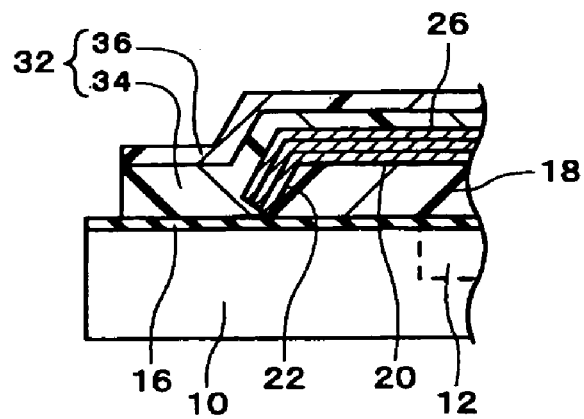
FIG. 4 is a partial sectional view of the semiconductor device according to an alternative exemplary embodiment of the present invention.
Figure 5:
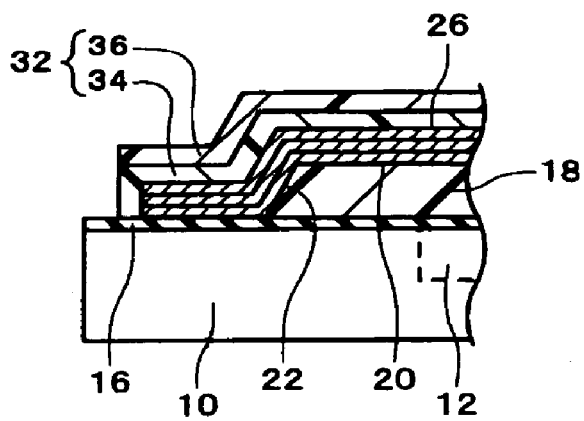
FIG. 5 is a partial sectional view of the semiconductor device according to an alternative exemplary embodiment of the present invention.
Figure 6:
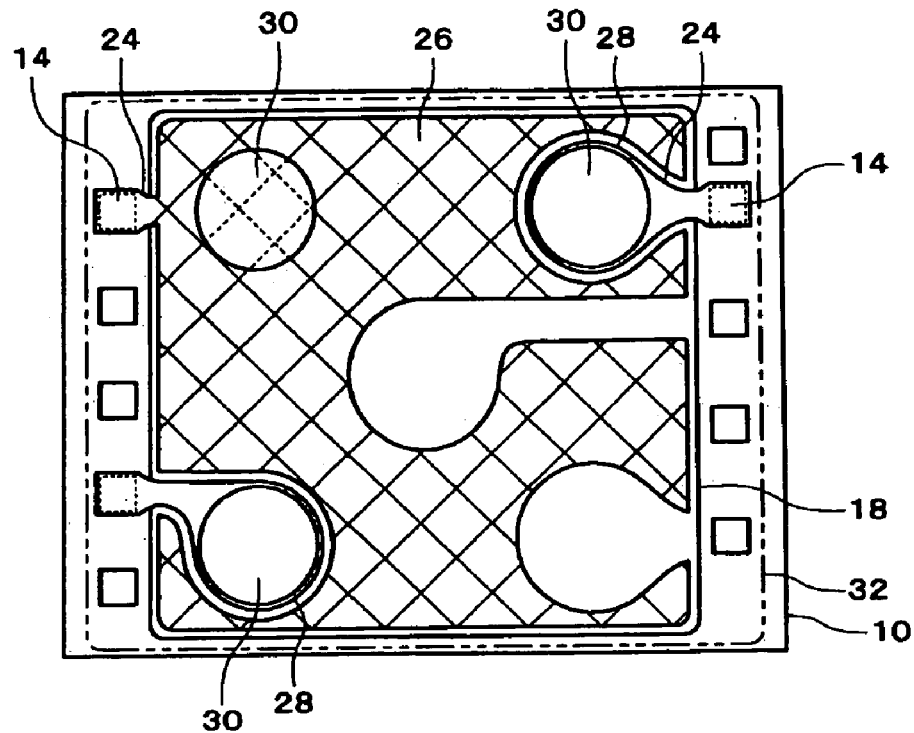
FIG. 6 is a plan view of the semiconductor device according to an alternative exemplary embodiment of the present invention.
Figure 7:
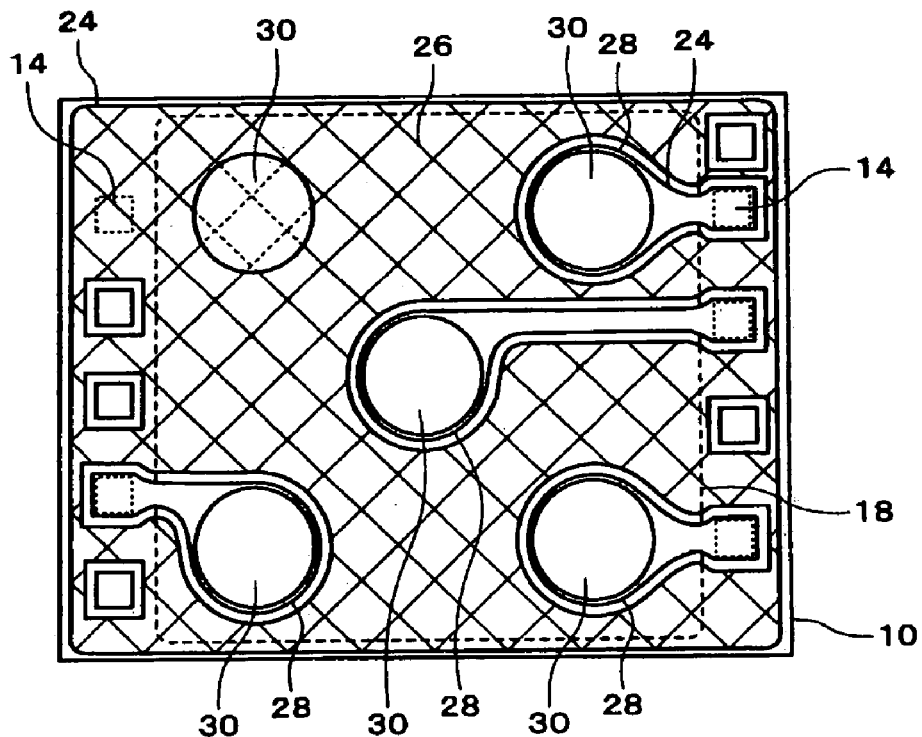
FIG. 7 is a plan view of the semiconductor device according to an alternative exemplary embodiment of the present invention.

FIG. 1 is a plan view of a semiconductor device according to an exemplary embodiment of the present invention. A portion of the semiconductor device (an insulating layer 32) is not illustrated. FIG. 2 is a sectional view (of a section indicated by II—II in FIG. 1) of the semiconductor device according to the exemplary embodiment of the present invention. FIG. 3 is a sectional view (of a section indicated by III—III in FIG. 1) of the semiconductor device according to the exemplary embodiment of the present invention. FIG. 4 through FIG. 7 illustrate a semiconductor device according to an alternative exemplary embodiment of the present invention. More specifically, FIG. 4 and FIG. 5 are partial sectional views of the semiconductor device, and FIG. 6 and FIG. 7 are plan views of the semiconductor device, with a portion (the insulating layer 32) of the semiconductor not illustrated.

A semiconductor device 1 includes a semiconductor substrate 10. The semiconductor substrate 10 may be a semiconductor chip as shown in FIG. 1, or it may be a semiconductor wafer. The semiconductor substrate 10 has an active element region 12, as shown in FIG. 2. The active element region 12 may be formed in the center of the semiconductor substrate 10. An integrated circuit includes active elements and passive elements. The active element region 12 is defined as a region of an integrated circuit that contains active elements (for example, a region where a plurality of active elements are formed in close proximity to one another). Outside the active element region 12 there may be a peripheral region where no active elements are present (for example, a passive element region of an integrated circuit).

Electrodes 14 (pads, for example) that are electrically connected to the integrated circuit are formed on the semiconductor substrate 10. In the case of a semiconductor chip, the semiconductor circuit (or the active element region 12) is typically formed in one (1) region. Conversely, in the case of a semiconductor wafer, the integrated circuit (or the active element region 12) is typically formed in a plurality of regions. A plurality of the electrodes 14 is formed on a desired surface of the semiconductor substrate 10. The plurality of electrodes 14 may be arrayed along the edges (for example, two opposing edges or four edges) of the semiconductor chip (or region to become a semiconductor chip). The electrodes 14 may be formed outside the active element region 12. A passivation layer 16 (for example, a silicon nitride layer or a silicon oxide layer) is formed on a surface (the surface on which the electrodes 14 are formed) of the semiconductor substrate 10.

A resin layer 18 including one (1) or a plurality of layers is formed on the surface (for example, on the passivation layer 16) of the semiconductor substrate 10 containing the electrodes 14. However, the resin layer 18 is not formed on top of the electrodes 14. As shown in FIG. 1, the resin layer 18 may be formed in the center of the semiconductor chip. The resin layer 18 may also be formed such that the sides of the resin layer 18 slope, so that the opposite surface (the bottom surface) of the resin layer 18 is larger than the top surface thereof. The resin layer 18 may also serve a stress relief function. The resin layer 18 may be made of any of polyimide resin, denatured silicon polyimide resin, epoxy resin, denatured silicon epoxy resin, benzocyclobutene (BCB), polybenzoxazole (PBO) or other resin. The resin layer 18 may also be formed between the semiconductor substrate 10 and the external terminals 30 described hereunder.

The resin layer 18 is formed in a region overlapping the active element region 12. The resin layer 18 is provided at least over the active element region 12. In this case, the area of the top surface 20 of the resin layer 18 on the semiconductor substrate 10 may be equal to the area of the active element region 12. Alternatively, the resin layer 18 may be provided over the active element region 12 only. If the active element region 12 is formed in the center of the semiconductor substrate 10, the area of the top surface 20 of the resin layer 18 on the semiconductor substrate 10 may be larger than the area of the active element region 12, and the resin layer 18 may be formed in the center of the semiconductor substrate 10.

The semiconductor device 1 includes wiring layers 24. The wiring layers 24 are formed on the surface of the semiconductor substrate 10 where the electrodes 14 are formed. The wiring layers 24 are made of an electrically conductive material (a metal, for example). A plurality of wiring layers 24 is formed, as shown in FIG. 1, and each of the wiring layers 24 is formed from one (1) layer or from a plurality of layers. The wiring layers 24 may be made of a plurality of different materials to provide the desired structural reliability and electrical characteristics. The plurality of materials may include, for example, copper (Cu), chromium (Cr), titanium (Ti), nickel (Ni), titanium-tungsten (TiW), gold (Au), aluminum (Al), nickel-vanadium (NiV), tungsten (W) or the like. The wiring layers 24 are formed so as to cover the electrodes 14, and the wiring layers 24 are electrically connected to the electrodes 14. The wiring layers 24 extend from the electrodes 14 to the top surface of the resin layer 18. The wiring layers 24 are formed so as to pass over the sides (sloped faces) 22 of the resin layer 18 and across the top surface 20 of the resin layer 18.

The wiring layers 24 include a plurality of electrically connecting portions (in the present exemplary embodiment, the first electrically connecting portion 26 and the second electrically connecting portion 28). The electrically connecting portions may be lands and are typically made of an electrically conductive material having a light-blocking effect (a quality whereby wavelengths to which the active element region 12 reacts are blocked). A plated layer (not shown) may be formed on the surface of the electrically connecting portions in order to enhance their electrical properties. If the electrically connecting portions are lands, the lands are larger in width than the lines of the wiring layers 24.

The semiconductor device 1 includes a plurality of external terminals 30. The external terminals 30 are formed on the surface of the semiconductor substrate 10 where the electrodes 14 are formed. The external terminals 30 are electrically connected to the electrodes 14. As shown in FIG. 1 and FIG. 2, the external terminals 30 are electrically connected to the wiring layer 24. The external terminals 30 may be provided on the electrically connecting portions. The external terminals 30 may be formed from an electrically conductive metal. The external terminals 30 may be made of a solder material. The external terminals 30 maybe spherical, for example, or may be solder balls, for example. In the example shown in FIG. 1, the plurality of external terminals 30 is symmetrically arranged on the semiconductor substrate 10, as viewed in the plan view.

The semiconductor device 1 may include an insulating layer (a layer made of resin, for example) 32. The insulating layer 32 may be made of a light-transmissive material, such as a semitransparent or transparent material. The insulating layer 32 is formed in one (1) layer or in a plurality of layers (the first insulating layer 34 and the second insulating layer 36 in the example shown in FIG. 2). The insulating layer 32 is provided on the surface of the semiconductor substrate 10 where the external terminals 30 are formed. More particularly, the insulating layer 32 is formed so as to cover the wiring layer 24 while avoiding the external terminals 30 (leaving the tops of the external terminals 30 exposed). The insulating layer 32 may be used as a solder resist.

As shown in FIG. 2, the insulating layer 32 includes a first insulating layer 34 and a second insulating layer 36. The first insulating layer 34 is formed after the wiring layers 24 and may be formed such that it covers at least a portion of the wiring layers 24. As shown in FIG. 2, the first insulating layer 34 may be formed such that at least the center portion of each of the electrically connecting portions is avoided. The first insulating layer 34 reduces or prevents oxidation, corrosion, discontinuity and other problems involving the wiring layer 24.

The second insulating layer 36 is deposited on the first insulating layer 34. The second insulating layer 36 is formed after the external terminals 30 and may be formed on the first insulating layer 34. The second insulating layer 36 is disposed in a manner that leaves the top of the external terminals 30 exposed. The second insulating layer 36 covers the base portion (lower portion) of the external terminals 30. The second insulating layer 36 thereby reinforces the base portion of the external terminals 30.

Of the plurality of electrically connecting portions in the present exemplary embodiment, the first electrically connecting portion 26 has a larger surface area than the second electrically connecting portion 28. (For example, the surface area of the first electrically connecting portion 26 may be twice as large or larger than the surface area of the second electrically connecting portion 28.) In other words, in a plan view of the semiconductor substrate 10, the outline of the first electrically connecting portion 26 is larger than the outline of the second electrically connecting portion 28.

In the example shown in FIG. 1, one (1) of any of the plurality of electrically connecting portions is the first electrically connecting portion 26, and all the rest (in FIG. 1, a plurality) are a second electrically connecting portion 28. Alternatively, a plurality of the first electrically connecting portion 26 may be formed. A related art or known land structure may be applied for the second electrically connecting portion 28. For example, the second electrically connecting portion 28 may be a round land describing a circular shape. In this case, the surface area of the second electrically connecting portion (land) 28 is defined as the area of the circular portion only. A line and a connecting portion (the connecting portion between the line and the land) of the wiring layer 24 are excluded. The second electrically connecting portion 28 may be formed on the top surface 20 of the resin layer 18. In this arrangement, the resin layer 18 absorbs stress applied to the second electrically connecting portion 28 (or external terminals 30).

As shown in FIG. 1, the first electrically connecting portion 26 may be formed in a shape that avoids the second electrically connecting portion 28. The first electrically connecting portion 26 may cover the entire surface (including the top surface 20 and the side surfaces 22) of the resin layer 18 except the second electrically connecting portion 28 and the area in the perimeter of the second electrically connecting portion 28. The first electrically connecting portion 26 may be formed on a portion of the top surface 20 of the resin layer 18 that overlaps the active element region 12 in plan view. In other words, the first electrically connecting portion 26 may be formed above the active element region 12, on the area of the resin layer's 18 top surface 20 that is situated above the active element region 12. This structure reduces or prevents incoming light from penetrating the active element region of the semiconductor substrate 10, and enhances the light-blocking effect of the semiconductor device. The first electrically connecting portion 26 also provides a shield effect, by blocking electromagnetic waves. Consequently, this structure reduces or eliminates semiconductor device malfunctions and enhances the reliability of the semiconductor device. Moreover, since the first electrically connecting portion 26 is formed on the resin layer 18, the resin layer 18 absorbs stress applied to the first electrically connecting portion 26.

As shown in the alternative example in FIG. 6, it is possible to omit any wiring layer 24 including any of the second electrically connecting portions 28 of the exemplary embodiment shown in FIG. 1. In other words, the first electrically connecting portion 26 may be used to form cut-out portions regardless of the second electrically connecting portion 28 (for example, a portion cut out in a shape slightly larger than the outside shape of the wiring layer 24 including the second electrically connecting portion 28). Accordingly, using the surface shape of one of the first electrically connecting portion 26, a plurality of types of wiring layer 24 patterns can be accommodated, thereby providing greater semiconductor device design flexibility.

The material of the first electrically connecting portion 26 may be the same as that used for the second electrically connecting portion 28, or it may be different. For example, the first electrically connecting portion 26 may include a material having a high light-blocking effect (for example, a less opaque metal), a material that cannot be used in the second electrically connecting portion 28. Moreover, the first electrically connecting portion 26 may have more layers of material than the second electrically connecting portion 28.

As shown in FIG. 1 and FIG. 3, the first electrically connecting portion 26 may cover nearly the entire top surface 20 of the resin layer 18. As shown in the partial sectional view of the semiconductor device in FIG. 4, the first electrically connecting portion 26 may also cover the sides (a sloped surface, for example) of the resin layer 18. In this case, the first electrically connecting portion 26 may cover the entire surface of the resin layer 18. As shown in the partial sectional view of the semiconductor device in FIG. 5, the first electrically connecting portion 26 may extend to a region of the semiconductor substrate 10 beyond the outside of the resin layer 18 (for example, a region where the passivation layer 16 is exposed). In other words, the first electrically connecting portion 26 may encompass the entire surface of the resin layer 18 (including the top surface 20 and the side surface 22) and a region on the outside of the resin layer 18. As shown in the plan view of the semiconductor device in FIG. 7, in the region on the outside of the resin layer 18, the first electrically connecting portion 26 may be formed in a manner that avoids the electrodes 14 and wiring layer 24.

Since the aforementioned exemplary embodiments enable a larger surface area to be covered by the first electrically connecting portion 26, the light-blocking effect and shield effect are further enhanced. More particularly, the first electrically connecting portion 26 reduces or prevents obliquely angled incident light from penetrating to the active element region 12.

The first electrically connecting portion 26 may also supply a ground potential or a power-source potential. As described above, since the surface area of the first electrically connecting portion 26 is larger than the surface area of the second electrically connecting portion 28, wiring layer 24 impedance is lowered, making the semiconductor device less susceptible to the effects of noise, for example. Moreover, as shown in FIG. 1, one (1) line may be connected to the first electrically connecting portion 26. Alternatively, two (2) more lines of the same potential may be connected to the first electrically connecting portion 26, if desired.

The first electrically connecting portion 26 may be formed in a shape and/or size that provides desired predetermined electrical characteristics. For example, the shape and/or size of the first electrically connecting portion 26 may be designed to achieve a predetermined value for the characteristic impedance of the wiring layer 24 (signal wire) of the second electrically connecting portion 28. Specifically, the shape and/or size of the first electrically connecting portion 26 may be determined after considering values, such as the distance between the first electrically connecting portion 26 and the wiring layer 24 of the second electrically connecting portion 28, the dielectric constant of the insulating layer 32, the width of the wiring layer 24 (signal line) of the second electrically connecting portion 28, and so forth.

The semiconductor device according to the present exemplary embodiments is structured as described above, and the effect is as described above.

A method of manufacturing the semiconductor device according to the present exemplary embodiment includes forming the electrodes 14 on the semiconductor substrate 10 and forming a resin layer 18 on the surface thereof, forming the wiring layer 24 so that it extends from the electrodes 14 and over the top of the resin layer 18, and providing external terminals 30 to the electrically connecting portions of the wiring layer 24. In the process of forming the wiring layer 24, a plurality of the electrically connecting portions are formed such that the surface area of the first electrically connecting portion 26 is greater than the surface area of the second electrically connecting portion 28. Moreover, other matters and effects can be inferred from the foregoing description relating to the above-mentioned semiconductor device and are therefore omitted.

Figure 8:
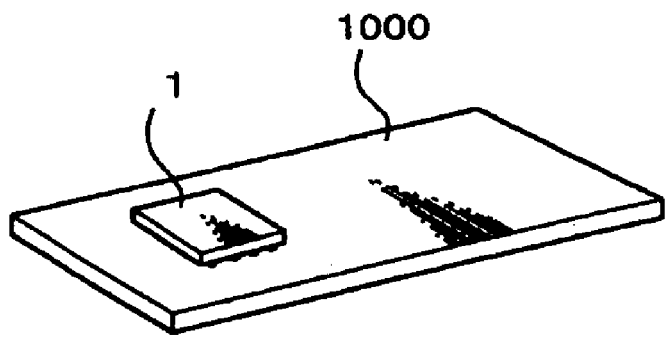
FIG. 8 is a schematic that shows the circuit board according to an exemplary embodiment of the present invention.
Figure 9:
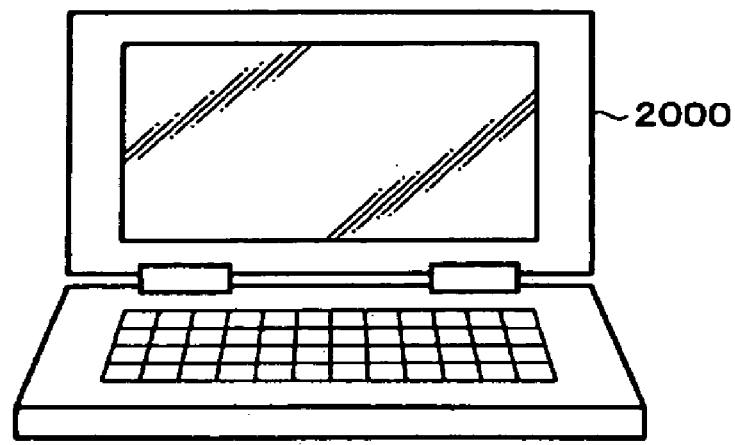
FIG. 9 is a schematic that shows an electronic apparatus according to an exemplary embodiment of the present invention.
Figure 10:
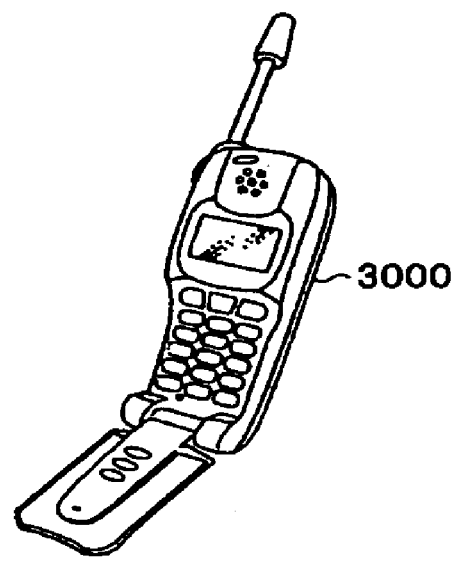
FIG. 10 is a schematic that shows an electronic apparatus according to an exemplary embodiment of the present invention.

FIG. 8 illustrates a circuit board 1000 on which a semiconductor device 1 according to the exemplary embodiment of the present invention is mounted. FIG. 9 and FIG. 10 each show a typical example of an electronic apparatus having the semiconductor device according to the exemplary embodiment of the present invention. FIG. 9 illustrates a notebook-type personal computer 2000, and FIG. 10 illustrates a cell phone 3000.

The present invention is not limited to the exemplary embodiment described above and may have a large variety of variations. For example, the present invention includes the configuration described in the exemplary embodiments, as well as configurations that are essentially the same thereto (for example, configurations whose functions, methods and results are the same, or configurations whose purpose and result are the same thereto). In addition, the present invention includes configurations in which parts nonessential to the configuration described in the exemplary embodiment are substituted. In addition, the present invention includes configurations that achieve the same effect as the configuration described in the exemplary embodiment, as well as configurations that can achieve the same purpose thereof. In addition, the present invention includes configurations in which related art technology or technology known in the art is added to the configuration described in the exemplary embodiment.

What is claimed is:

1. A semiconductor device, comprising:
    a semiconductor substrate that includes an active element and an integrated circuit having an active element in the active element region;
    electrodes electrically connected to the integrated circuit, the electrodes including a first electrode and a second electrode;
    a resin layer that is formed on a surface of the semiconductor substrate where the electrode is also formed, so as to avoid at least a part of the electrodes;
    a wiring layer that extends from the electrode and across a top of the resin layer, and includes a plurality of electrically connecting portions, the plurality of electrically connecting portions including a first electrically connecting portion electrically connected to the first electrode and a second electrically connecting portion electrically connected to the second electrode, a surface area of the first electrically connecting portion being larger than a surface area of the second electrically connecting portion, the surface area of the first electrically connecting portion being larger than the active element region; and an external terminal that is provided on the electrically connecting portions.

2. The semiconductor device according to claim 1, the second electrically connecting portion being formed on the top surface of the resin layer.

3. The semiconductor device according to claim 1, the resin layer overlapping the active element region of the semiconductor substrate; and
the first electrically connecting portion being formed on the area of the resin layer that overlaps the active element region.

4. The semiconductor device according to claim 1, the first electrically connecting portion being formed so as to cover nearly the entire top surface of the resin layer.

5. The semiconductor device according to claim 4, the first electrically connecting portion being formed so as to further cover a side surface of the resin layer.

6. The semiconductor device according to claim 5, the first electrically connecting portion being formed so as to extend to the region of the substrate beyond the resin layer.

7. The semiconductor device according to claim 1, the first electrically connecting portion supplying at least one of a ground potential and a power-source potential.

8. The semiconductor device according to claim 7, the first electrically connecting portion being formed in at least one of a shape and a size that provides predetermined electrical characteristics.

9. The semiconductor device according to claim 1, further comprising an insulating layer formed so as to cover the wiring layer while avoiding the external terminal.

10. The semiconductor device according to claim 1, the semiconductor substrate being at least one of a semiconductor chip and a semiconductor wafer.

11. A semiconductor device, comprising:
a semiconductor substrate that includes an active element region and an integrated circuit having an active element in the active element region;
electrodes electrically connected to the integrated circuit, the electrodes including a first electrode and a second electrode;
a resin layer that is formed on a surface of the semiconductor substrate where the electrode is also formed, so as to avoid at least a part of the electrodes;
a wiring layer that extends from the electrode and across a top of the resin layer, and includes a plurality of electrically connecting portions, the wiring layer including a first electrically connecting portion electrically connected to the first electrode and a second electrically connecting portion electrically connected to the second electrode, the first electrically connecting portion covering the entire surface of the resin layer except for the area occupied by the wiring layer including the second electrically connecting portion and the area surrounding the wiring layer including the second electrically connecting portion, the surface area of the first electrically connecting portion being larger than the active element region; and
an external terminal that is provided on the electrically connecting portions.

12. A circuit board, comprising:
the semiconductor device according to claim 1.

13. An electronic device, comprising:
the semiconductor device according to claim 1.

14. A method of manufacturing a semiconductor device, comprising:
(a) forming a resin layer on a surface of a semiconductor substrate, the semiconductor substrate including an active element region, an integrated circuit having an active element in the active element region, and electrodes electrically connected to the integrated circuit, the electrode including a first electrode and a second electrode, the resin layer being formed so as to avoid at least a part of the electrodes;
(b) forming a wiring layer from the electrode across a top of the resin layer so that the wiring layer include a plurality of electrically connecting portions, the plurality of electrically connecting portions include a first electrically connecting portion and a second electrically connecting portion;
(c) providing an external terminal on the electrically connecting portions; and wherein the plurality of electrically connecting portions formed in step (b) so that a surface area of a first electrically connecting portion is larger than a surface area of a second electrically connecting portion and the surface area of the first electrically connecting portion being larger than the active element region.

* * * * *